United States Patent [19]
Higgins, Jr.

[11] Patent Number: 5,373,264
[45] Date of Patent: Dec. 13, 1994

[54] NEGATIVE RESISTANCE OSCILLATOR WITH ELECTRONICALLY TUNABLE BASE INDUCTANCE

[75] Inventor: Thomas M. Higgins, Jr., Spokane, Wash.

[73] Assignee: Hewlett-Packard Company, Palo Alto, Calif.

[21] Appl. No.: 6,878

[22] Filed: Jan. 21, 1993

[51] Int. Cl.⁵ .............................................. H03B 5/12
[52] U.S. Cl. .............................. 331/117 R; 331/177 V
[58] Field of Search ............. 331/115, 117 R, 117 FE, 331/117 D, 132, 177 V

[56] References Cited

U.S. PATENT DOCUMENTS

| | | | |
|---|---|---|---|
| 3,384,835 | 5/1968 | Racy | 331/177 V |
| 3,582,823 | 6/1971 | Pasos | 331/177 VX |
| 5,045,825 | 9/1991 | McJunkin | 333/222 |
| 5,055,889 | 10/1991 | Beall | 331/177 VX |
| 5,097,228 | 3/1992 | McJunkin | 331/176 |
| 5,130,673 | 7/1992 | McJunkin | 331/96 |

FOREIGN PATENT DOCUMENTS

WO85/00942 A1 7/1984 WIPO ............................ H03C 3/08

OTHER REFERENCES

WO85/00942 A1, Filed 07/26/84, "Linear Gain Voltage Controlled Oscillator With Modulation Compensation," Rice, et al, World Office, 2/28/85

*Primary Examiner*—David Mis

[57] ABSTRACT

Problems associated with compromise, fixed base inductances in negative resistance oscillators are overcome by use of an electronically tunable base network. Parameters such as phase noise and output power can thereby be optimized over a wide range of operating conditions. The disclosure is illustrated with reference to a 500–1000 Mhz voltage controlled oscillator employing base-tuning varactors that are slaved to the VCO's tuning signal.

15 Claims, 2 Drawing Sheets

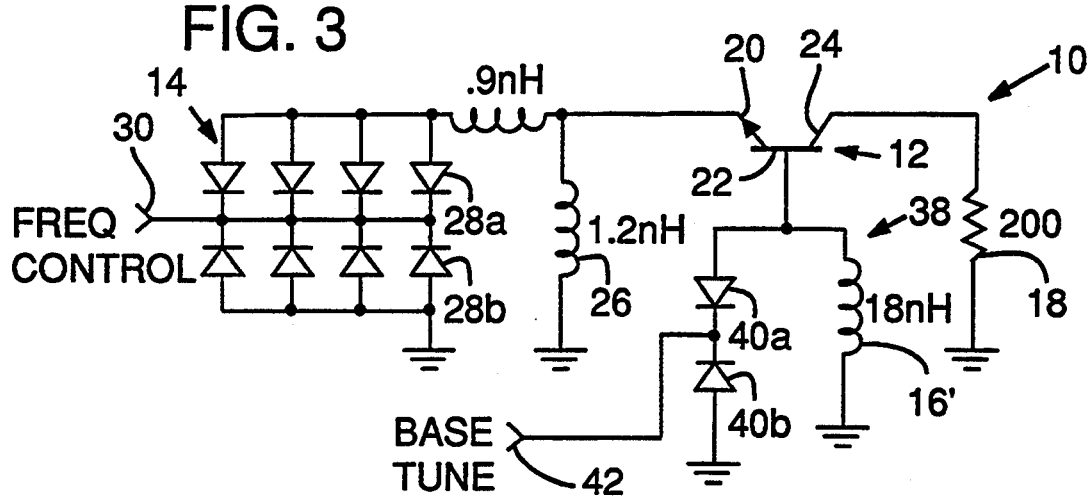
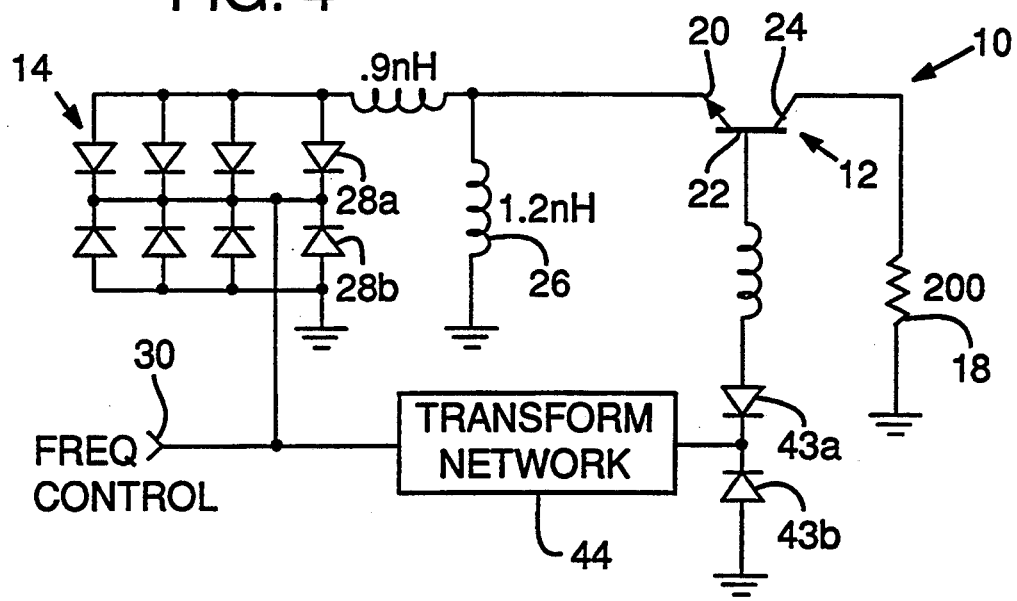

5,373,264

NEGATIVE RESISTANCE OSCILLATOR WITH ELECTRONICALLY TUNABLE BASE INDUCTANCE

FIELD OF THE INVENTION

The present invention relates to oscillator circuitry, and more particularly relates to a method and apparatus for enhancing operation of a negative resistance oscillator.

BACKGROUND OF THE INVENTION

There are a number of operational parameters that can be of concern in oscillator operation, depending on the oscillator's intended application. In oscillators intended for measurement instrumentation applications, for example, "phase noise" is often a critical parameter. Other parameters of concern may include output power and compression characteristic. Many of these parameters are influenced by the base inductance (or gate inductance) of the oscillator transistor.

In an oscillator intended for fixed frequency operation, it is relatively straightforward to select a base inductance that optimizes parameters of particular concern. However, a serious problem is evident in oscillators that can be tuned to operated over a broad band of frequencies: what base inductance should be selected?

The usual approach is to select a fixed, compromise base inductance that permits adequate (rather than optimum) oscillator operation over a desired range of frequencies. By so doing, however, optimum oscillator performance is achieved at only one frequency, if at all. Further, the use of fixed base inductance necessarily limits the range of possible operating frequencies, sometimes preventing certain design criteria from being met.

An alternative approach is to electronically alter the topology of the base inductance network to provide different inductances at different frequencies. This can be accomplished by means such as PIN diodes that switch certain circuit elements into or out of the circuit when predetermined tune voltage thresholds are passed. This approach, however, suffers by reason of its complexity and by reason of parasitic problems associated with the additional circuit elements.

Another approach is to design a network that achieves a desired reactance vs. frequency characteristic across the band of interest. However, this approach is difficult to implement without introducing too much loss.

SUMMARY OF THE INVENTION

In accordance with the preferred embodiment of the present invention, the inductive reactance at the base of a negative resistance oscillator is changed as a function of frequency by electronically tuning a reactive component. This results in an optimized base inductance without the drawbacks associated with topology-switching or complex network arrangements. In a particular example, variation of the base inductance is achieved by utilizing a varactor-tunable tank circuit. As the oscillation frequency is changed, the varactor is tuned correspondingly to provide an optimum base reactance.

The foregoing and additional features and advantages of the present invention will be more readily apparent from the following detailed description, which proceeds with reference to the accompanying drawings.

BRIEF DESCRIPTION OF THE DRAWINGS

FIG. 3 is a schematic diagram of a wideband bipolar oscillator according to the present invention.

FIG. 4 is a partial oscillator schematic showing an alternative tunable base network, and a transform network for deriving the BASE TUNE signal from the FREQUENCY CONTROL signal.

DETAILED DESCRIPTION OF A PREFERRED EMBODIMENT

Figure 1:
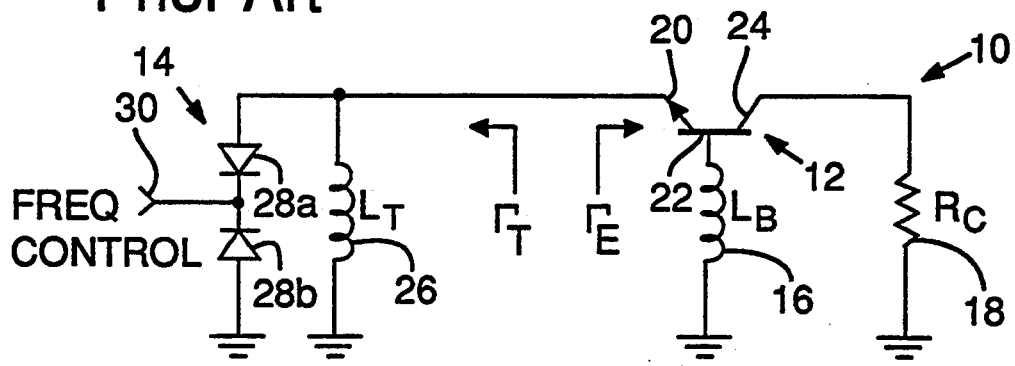
FIG. 1 is a schematic diagram of a prior art wideband negative resistance oscillator.

Referring to FIG. 1, a prior art negative resistance voltage controlled oscillator (VCO) 10 typically includes an active device 12, a frequency-setting tank circuit 14, a base inductance 16, and an output load 18. (The oscillator's bias circuitry is omitted from FIG. 1 for clarity of illustration.)

The illustrated active device 12 is a bipolar transistor, such as a NEC type NE21935, and has emitter, base and collector terminals 20, 22, 24. The tank circuit 14 determines the frequency of oscillation and here includes an inductor 26 shunted by two series-connected varactor diodes 28a, 28b. As is well understood in the art, the varactor diodes exhibit a capacitive effect, the magnitude of which is electronically controllable by the a tune voltage applied to a FREQUENCY CONTROL input port 30. In the illustrated oscillator, the varactors 28 are Siemens type BB109 and exhibit a capacitance range of about 6–24 picofarads as the bias voltage ranges from 20–4 volts.

In negative resistance oscillators, the base inductor 16 (in conjunction with the load resistance 18 and the parasitic capacitance of the transistor) determines the impedance looking into the emitter 20 of the transistor. This impedance is denoted by its reflection coefficient $\Gamma_E$ and includes a reactive component and a negative resistive component. If the magnitude of the negative resistance is less than the parallel resistance of the oscillator tank 14, the parallel combination of the two will be a negative resistance, resulting in a growing oscillation. The oscillation grows until a limiting mechanism in the circuit 10 reduces the gain of the circuit, which increases the value of the negative real part of the emitter impedance. The oscillation stabilizes when the real part of the emitter impedance is equal and opposite to the parallel resistance of the tank 14, resulting in a tank with infinite Q.

Best phase noise is achieved if the oscillation frequency stabilizes at or very close to the parallel resonance of the tank 14, since the tank impedance has the highest phase slope at this point. Therefore, it is desirable to have the reactive part of the transistor impedance as small as can be achieved to minimize the amount that the oscillation frequency is pulled.

A useful tool for analyzing this problem is to separately plot the reflection coefficients of the tank ($\Gamma_T$) and transistor circuit ($\Gamma_E$) on a Smith chart. Since the transistor impedance has a negative real part, $\Gamma_E$ is greater than unity, and loops outside the Smith chart. This loop can become quite large, so it is more useful to plot $\Gamma_E^{-1}$; all points outside the unit circle map inside. The impedance shown on the Smith chart will be opposite in sign but equal in magnitude to the actual emitter impedance.

Figure 2:
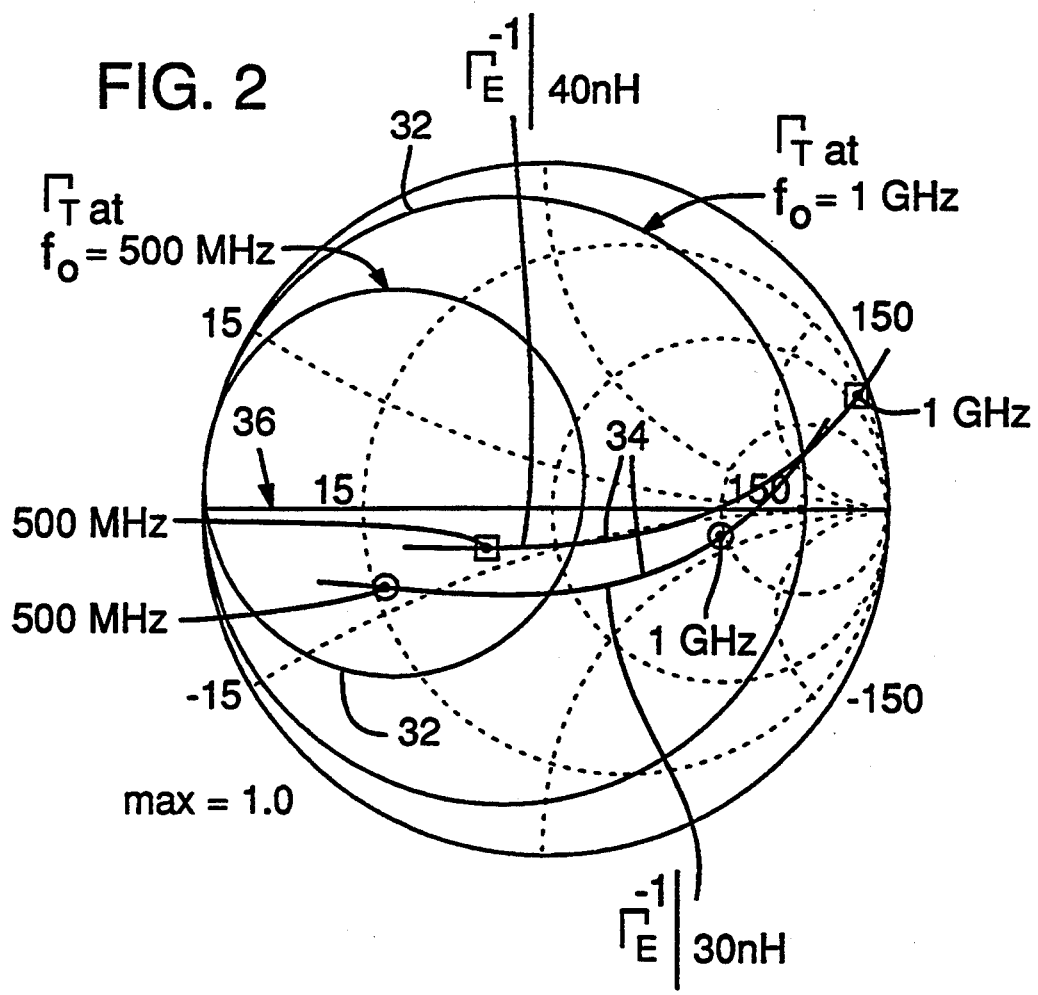
FIG. 2 is a Smith chart showing tank impedance circles at 500 Mhz and 1 Ghz, and showing the inverse of the transistor reflection coefficient as a function of frequency.

As depicted in FIG. 2, a plot of $\Gamma_T$ for a parallel resonant tank 14 on a Smith chart produces a circle 32 tangent to the unit circle at $-1$; this is a constant admittance circle. If the reciprocal of the emitter reflection coefficient $\Gamma_E^{-1}$ 34 falls inside the tank circle 32, then the magnitude of the negative resistance presented by the emitter 20 is lower than the resistance of tank 14, and the circuit will oscillate. Selecting a value for base inductor 16 which places the starting point for the transistor just inside the tank circle 32 and as close to the real axis 36 as possible will ensure that the oscillation starts as close as possible to the tank parallel resonant frequency. However, if the inductor 16 is made too large, the starting point lies outside the tank circle 32 and the circuit 10 will not oscillate.

This exercise is straightforward for a single frequency, but in a wideband VCO, $\Gamma_E^{-1}$ must fall inside the tank circle 32 at all desired frequencies of oscillation. If the tank Q is constant, the parallel resistance for a varactor-tuned tank circuit will increase by a factor of 4 to 1 over an octave tuning range, and the transistor's negative resistance does not necessarily track this variation properly. Typically the negative resistance will increase at the high end of the frequency range more rapidly than the tank impedance because of lower gain in the transistor. The result is that selecting a base inductor 16 which allows enough gain for oscillation at the high end of the tune range will be too small for best phase noise at the low end.

In FIG. 2, the $\Gamma_E^{-1}$ curves are plotted for fixed base inductances of 30 and 40 nH and depict reflection coefficients over the 500–1000 Mhz frequency range. It can be seen that as frequency increases, the emitter reflection coefficient $\Gamma_E^{-1}$ 34 moves to the right, corresponding to an increase in the parallel negative resistance. Notice that at 1000 Mhz, $\Gamma_E^{-1}$ is just inside the 1000 Mhz tank circle very near parallel resonance for the 30 nH base inductor. But at 500 Mhz, $\Gamma_E^{-1}$ is well inside the 500 Mhz tank circle and definitely not optimum. There is too much excess gain, and the oscillation frequency may stabilize far from the parallel resonant frequency, resulting in poor phase noise. Increasing to 47 nH is an improvement at 500 MHz, but lies outside the tank impedance circle at 1000 MHz, so it will not oscillate.

Empirical data also demonstrate this effect. Several base inductor values were tried in a breadboard of the above circuit. Table 1 shows the phase noise in dBc/Hz achieved as a function of frequency and base inductor value.

TABLE 1

| | Phase Noise vs. Base Inductor | | | | |
|---|---|---|---|---|---|
| | Base Inductor | | | | |
| Frequency | 24 nH | 27 nH | 30 nH | 33 nH | 36 nH |
| 500 | −130 | −132.5 | −134 | −135 | −136 |
| 750 | −132 | −134 | −136 | −136 | −137.5 |
| 1000 | −133 | −135 | −137 | −136* | — |

*Not a full power oscillation

Note that best phase noise is achieved at 1000 Mhz with a 30 nH base inductor, shortly before the oscillator runs out of gain. With a 33 nH base inductor, there is not enough excess gain to limit at full power. However, significantly higher base inductance is needed for best operation at lower frequencies. Larger inductors than 36 nH will result in further improvement at 500 MHz.

In this case, best overall noise at full power is achieved with a base inductance of 30 nH, with phase noise better than −134 dBc/Hz everywhere. If a different base inductance could be selected for each frequency, however, the worst case noise could be −137 dBc/Hz over the entire octave.

One method of achieving this goal is to switch in different base inductances at different frequencies, such as by using PIN diodes. However, this approach is complex and can suffer from parasitics and loss in UHF oscillators. Another approach is to design a network that achieves the desired reactance characteristics across the band. However, this is difficult to accomplish without introducing too much loss.

These drawbacks can be overcome by using a varactor-tuned tank 38 as the base 'inductor.' Operated somewhat below parallel resonance, a wide range of inductive reactances can be realized. Such a circuit is shown in FIG. 3 and includes varactors 40a and 40b connected across an inductor 16'. A BASE TUNE signal is applied to input 42 and controls the capacitance presented across inductor 16' by the varactors 40. The illustrated varactors 40 are Siemens type BB105 and exhibit a capacitance range of about 2–8 picofarads as the bias voltage ranges from 20–4 volts.

At any given frequency, the inductive reactance seen by the base of the transistor can be modified by tuning the base varactors. If the resonant frequency of the base tank is tuned very near the frequency of oscillation, the inductive reactance can get quite large, to the point of killing the oscillation. The optimum voltage for the BASE TUNE signal can be found by lowering the base tank resonant frequency until the circuit has only enough excess gain to ensure a full power oscillation.

The circuit of FIG. 3 shows a 3 dB improvement in phase noise over the 500–1000 Mhz octave. Effective inductances from 60 nH at 500 Mhz to 30 nH at 1 Ghz were used to achieve the results in Table 2.

TABLE 2

| Phase Noise: Fixed vs. Tuned Base Inductance | | |
|---|---|---|
| | Base Inductance | |
| Frequency | 30 nH | Tuned |
| 500 | −134 | −137 |
| 750 | −136 | −138 |
| 1000 | −137 | −137 |

FIG. 4 shows an alternative base network in which the tunable element (again a pair of varactors 43) is connected in series with a base inductor 16''. A variety of other electronically tunable base network topologies will be apparent to those skilled in the art.

In all such embodiments, the BASE TUNE signal is desirably slaved to the FREQUENCY CONTROL signal so that they change in tandem. In the preferred embodiment, the optimum BASE TUNE voltage for each frequency is determined empirically, and a network 44 is then designed to output the desired BASE TUNE signal (or an approximation thereof) in response to the FREQUENCY CONTROL signal input thereto. In some cases, of course, the FREQUENCY CONTROL signal can be used directly as the BASE TUNE signal, in which case no intervening network is needed. More commonly, however, some sort of transforming network is utilized. In its simplest form, the network 44 can be purely passive, such as a resistor network. Alternatively, it can employ one or more active devices to achieve more complex non-linear transfer characteristics. In still other embodiments, the network can include a ROM that serves as a look-up table to output a desired BASE TUNE signal for each different FREQUENCY CONTROL signal. (Appropriate conversion between the analog and digital domains is of course required in such an implementation.) In yet other arrangements, discontinuous transfer characteristics can be implemented, such as by use of threshold detectors to provide one of a plurality of discrete BASE TUNE voltages in response to the FREQUENCY CONTROL signal.

From the foregoing it will be recognized that the present invention provides a simple, yet effective solution to a class of problems (i.e. those associated with fixed base inductances) that has heretofore been accepted as an inherent failing of wideband oscillators.

For additional reading on wideband oscillators, including phase noise and output power considerations, the reader is referred to U.S. Pat. Nos. 5,045,825, 5,097,228 and 5,130,673, each to McJunkin, the disclosures of which are incorporated by reference.

Having described and illustrated the principles of my invention with reference to a preferred embodiment thereof, it will be apparent that the invention can be modified in arrangement and detail without departing from such principles. For example, while the invention has been illustrated with reference to a bipolar transistor oscillator, it will be recognized that the invention is equally applicable to FET oscillators and oscillators employing other devices. Accordingly, use of the term "base" in the claims should be construed to cover counterpart elements in other devices, such as the gate of a field effect transistor, etc. Similarly, while the invention has been illustrated with reference to a system for optimizing phase noise as oscillator frequency is varied, it will be recognized that the same inventive principles can be used to optimize other oscillator parameters in response to frequency or other variables. Similarly, while the invention has been illustrated with reference to a circuit employing a lumped element inductor 16, it will be recognized that the invention is well suited for application to circuits based on microstrip and similar techniques.

In view of the wide variety of embodiments to which the principles of my invention may be applied, it should be apparent that the detailed embodiments are illustrative only and should not be taken as limiting the scope of my invention.

Rather, I claim as my invention all such modifications as may come within the scope and spirit of the following claims and equivalents thereto I claim:

1. An oscillator comprising:
   an active device having first, second and third terminals;
   a tank circuit having a resonant frequency, the tank circuit being coupled to the first terminal, said resonant circuit including a first circuit element responsive to a first signal for varying the resonant frequency of said tank circuit;
   an output coupled to the third terminal for providing an oscillator output signal;
   said oscillator having an operational characteristic other than frequency which is dependent, at least in part, on a reactance presented to the second terminal of the active device by a network coupled thereto;
   said network coupled to the second terminal including a second circuit element responsive to a second signal for varying the reactance presented to the second terminal by the network; and
   means for providing to the second circuit element with the second signal, said second signal tending to optimize said characteristic as a function of oscillator frequency.

2. The oscillator of claim 1 in which the second circuit element comprises a varactor.

3. The oscillator of claim 1 which further includes means for deriving the second signal from the first signal.

4. The oscillator of claim 1 in which the operational characteristic is phase noise.

5. The oscillator of claim 1 in which the operational characteristic is compression.

6. The oscillator of claim 1 in which:
   the frequency of oscillator operation is a function of the tank circuit resonant frequency and of a reactance presented to the tank circuit by the first terminal of the active device;
   the second signal tends to minimize the reactance presented to the tank circuit by the first terminal of the active device as the frequency of oscillator operation is changed;
   wherein the frequency of oscillator operation substantially matches the resonant frequency of the tank circuit.

7. In a method of operating an oscillator, the oscillator including an active device that has a base terminal thereof coupled to ground through a base network, the base network serving to couple RF signals between the base terminal and ground, an improvement comprising electronically altering a reactance of the base network without changing the topology of said network so as to tailor a parameter of oscillator operation as a function of frequency.

8. The method of claim 7 which further includes electronically tuning a capacitive element to alter the reactance of the base network.

9. The method of claim 7 in which the oscillator is electronically tunable in response to a frequency control signal, and in which the method further includes:
   deriving from said frequency control signal a base tune signal; and
   electrically altering the reactance of the base network in response to the base tune signal.

10. The method of claim 9 which includes changing the base tune signal linearly with changes in the frequency control signal.

11. The method of claim 7 which includes tailoring a phase noise characteristic as a function of frequency.

12. The method of claim 7 which includes tailoring a compression characteristic as a function of frequency.

13. The method of claim 7 which includes:
   tuning a frequency-determining network of said oscillator with a first signal so as to change a frequency of an oscillator output signal; and
   electrically altering the reactance of the base network by applying a second signal thereto, said second signal being derived from said first signal.

14. In a method of operating a voltage controlled oscillator over a range of frequencies, the oscillator including a tank circuit having a resonant frequency responsive to a tuning voltage applied to a varactor therein, the tank circuit being coupled to a transistor, the transistor presenting to the tank circuit an impedance, any reactive part of said impedance serving to pull an oscillator output frequency from said resonant frequency, an improvement comprising applying an optimizing voltage to a reactive element in a network coupled to a transistor base terminal so as to reduce the reactive part of the impedance presented to the tank circuit by the transistor while still permitting oscillation, and without changing a topology of said network.

15. The method of claim 14 which includes deriving the optimizing voltage from the tuning voltage.

* * * * *